(12) United States Patent
Taussig et al.

(10) Patent No.: US 9,728,563 B2
(45) Date of Patent: Aug. 8, 2017

(54) COMBINATORIAL MASKING

(71) Applicant: Applied Materials, Inc., Santa Clara, CA (US)

(72) Inventors: Carl P. Taussig, Palo Alto, CA (US); Han-Jun Kim, Palo Alto, CA (US); Ohseung Kwon, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/437,454

(22) PCT Filed: Oct. 26, 2012

(86) PCT No.: PCT/US2012/062309
§ 371 (c)(1),
(2) Date: Apr. 21, 2015

(87) PCT Pub. No.: WO2014/175850
PCT Pub. Date: Oct. 30, 2014

(65) Prior Publication Data
US 2015/0279874 A1    Oct. 1, 2015

(51) Int. Cl.
*H01L 27/12*    (2006.01)
*H01L 21/027*   (2006.01)
*H01L 21/033*   (2006.01)

(52) U.S. Cl.
CPC ........ *H01L 27/1288* (2013.01); *H01L 21/027* (2013.01); *H01L 21/0337* (2013.01);
(Continued)

(58) Field of Classification Search
CPC .............. H01L 27/1288; H01L 27/124; H01L 27/1255; H01L 27/127; H01L 27/3244;
(Continued)

(56) References Cited

U.S. PATENT DOCUMENTS

2005/0136639 A1*  6/2005  Davidson .......... H01L 21/76838
                                                438/612
2006/0240334 A1* 10/2006  Huh ....................... B82Y 10/00
                                                430/5
(Continued)

FOREIGN PATENT DOCUMENTS

JP        2009-158941 A      7/2009
JP        2010-199570 A      9/2010
(Continued)

OTHER PUBLICATIONS

International Search Report dated Nov. 13, 2014 for Application No. PCT/US2012/062309.
(Continued)

*Primary Examiner* — Galina Yushina
(74) *Attorney, Agent, or Firm* — Patterson + Sheridan, LLP

(57) ABSTRACT

A method of combinatorial masking employs a combinatorial etch mask that includes a top layer of a stack of material layers and a secondary mask on the top layer to etch other material layers of the stack. The method includes patterning a first layer at a top of the stack of material layers, and providing the secondary mask on top of the patterned first layer. The method further includes etching other material layers of the stack including a second layer below the first layer with the combinatorial mask and then etching the first layer along with the other material layers of the stack excluding the second layer using the secondary mask as an etch mask.

15 Claims, 7 Drawing Sheets

(52) U.S. Cl.
CPC .......... *H01L 27/124* (2013.01); *H01L 27/127* (2013.01); *H01L 27/1255* (2013.01)

(58) Field of Classification Search
CPC ....... H01L 2224/03903; H01L 21/0337; H01L 21/027; H01L 21/033; H01L 21/0465; H01L 21/266; H01L 21/32; H01L 21/426; H01L 21/311; H01L 21/3213
See application file for complete search history.

(56) References Cited

U.S. PATENT DOCUMENTS

| | | | | |
|---|---|---|---|---|
| 2006/0275963 | A1* | 12/2006 | Mei | H01L 29/42384 438/160 |
| 2007/0048959 | A1* | 3/2007 | Dietz | G03F 7/70425 438/372 |
| 2007/0235856 | A1* | 10/2007 | Haba | H01L 21/4853 257/697 |
| 2008/0067613 | A1* | 3/2008 | Anderson | H01L 29/41791 257/401 |
| 2009/0152559 | A1* | 6/2009 | Miyairi | H01L 27/1214 257/66 |
| 2010/0078640 | A1* | 4/2010 | Mei | H01L 27/1214 257/59 |
| 2010/0187535 | A1* | 7/2010 | Suzawa | H01L 27/1288 257/66 |
| 2010/0294352 | A1* | 11/2010 | Srinivasan | C21D 1/34 136/256 |
| 2011/0300401 | A1* | 12/2011 | Yamanishi | B32B 15/018 428/607 |
| 2012/0153312 | A1* | 6/2012 | Chou | H01L 27/1255 257/88 |
| 2013/0147030 | A1* | 6/2013 | Chang | H01L 23/49838 257/737 |

FOREIGN PATENT DOCUMENTS

| | | |
|---|---|---|
| KR | 100527816 B1 | 11/2005 |
| KR | 1020060110480 | 10/2006 |
| KR | 1020070040134 | 4/2007 |
| KR | 1020080034568 | 4/2008 |
| WO | 2009-072451 A1 | 6/2009 |

OTHER PUBLICATIONS

Office Action for Japanese Application No. 2015-539567 dated May 18, 2016.

* cited by examiner

COMBINATORIAL MASKING

CROSS-REFERENCE TO RELATED APPLICATIONS

N/A

STATEMENT REGARDING FEDERALLY SPONSORED RESEARCH OR DEVELOPMENT

N/A

BACKGROUND

Multilayer integrated circuits such as, but not limited to, multilayer active matrix backplane circuits are increasingly important in the production and economic viability of a wide variety of electronic devices. For example, many flat panel displays including, but not limited to, liquid crystal displays (LCDs), electrophoretic displays (EPD) and organic light emitting diode (OLED) displays typically employ some form of an active matrix backplane. The active matrix backplane may provide thin film transistors to store display states as well as to source current in some implementations (e.g., for OLED displays). Multilayer active matrix backplanes may facilitate tighter pixel spacing in flat panel displays, in some examples. In particular, employing multiple layers in circuitry of the active matrix backplane may enable components to be positioned closer to one another than would be possible in a design that did not employ multilayer circuitry, for example. Likewise, a similar advantage to multiple circuit layers may be provided in other applications that use multilayer integrated circuits.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Figure 1:
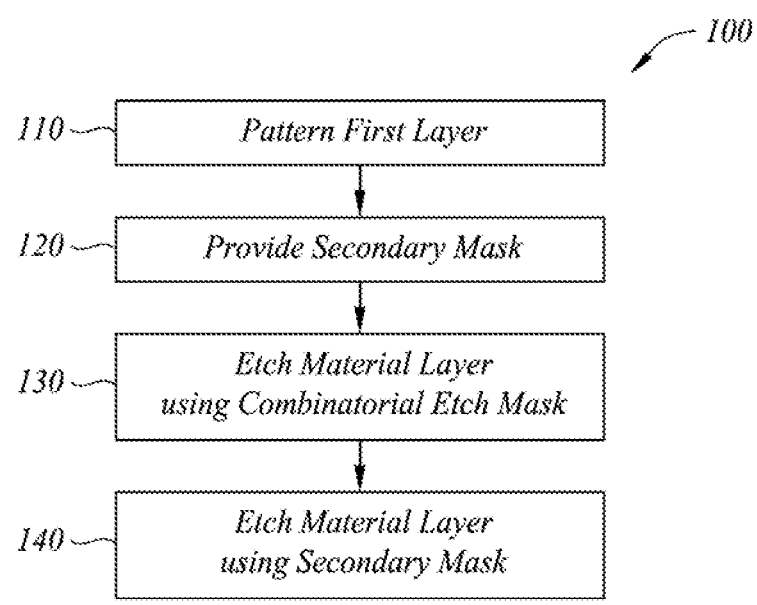
FIG. 1 illustrates flow chart of a method of combinatorial masking, according to an example consistent with the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide combinatorial masking and a multilayer active matrix backplane fabricated with combinatorial masking. Combinatorial masking, according to the principles described herein, may be used to manufacture a multilayer construct or circuit such as, but not limited to, an active matrix backplane in fewer steps and at a potentially lower cost than may be possible without combinatorial masking. In particular, combinatorial masking may facilitate fabrication of a multilayer circuit without requiring multiple passes through a vacuum deposition system. Instead, all vacuum deposition used to provide circuit layers of the multilayer circuit may be performed in a single operation, albeit with sequential deposition of different materials, for example. Patterning and formation of elements of the multilayer circuit are then performed with combinatorial masking to yield a final multilayer circuit (e.g., the multilayer active matrix backplane) that may include fewer steps than without combinatorial masking. For example, combinatorial masking may reduce masking steps in patterning and formation by substantially eliminating two steps from a typical number of between four and five steps. Moreover, combinatorial masking may provide for patterning of a buried layer to provide conductor crossovers and to isolate elements formed by or within the buried layer even though the buried layer is deposited along with the other layers before patterning of the buried layer.

Combinatorial masking employs a pair of material layers of the multilayer circuit having mutually exclusive selective etch resistance, according to various examples consistent with the principles described herein. Herein, 'mutually exclusive selective etch resistance' is defined with respect to a pair of material layers as an ability to etch a first material layer of pair without substantially affecting a second layer and an ability to etch the second material layer of the pair without substantially affecting the first material layer. For example, for a given pair of material layers comprising different materials, if an etchant or etching method exists that will etch the first material layer of the pair without etching exposed portions of the second material layer then the second layer has or exhibits selective etch resistance exclusive of or with respect to the first material layer. Similarly, if an etchant or etching method exists that will etch the second material layer of the pair without etching exposed portions of the first material layer then the first layer has or exhibits selective etch resistance exclusive of or relative to the second material layer. When a combination of the first and second material layers along with respective etchants or etching methods exists, then the first material layer and second material layer have or exhibit mutually exclusive selective etch resistance, by definition herein. For example, a material layer comprising titanium may be etched using a fluorocarbon (C—F) plasma and another material layer comprising aluminum may be etched using phosphoric acid ($H_3PO_4$). However, C—F plasma may not etch the material layer comprising aluminum while $H_3PO_4$ may not etch the titanium-comprising material layer, according to some examples. In this example, the material layer comprising titanium has mutually exclusive selective etch resistance with respect to the material layer comprising aluminum, by definition herein.

Herein, by definition, a plurality of substantially planar layers is 'self-coplanar' when material of any particular layer of the plurality is substantially confined to the particular layer. For example, consider a first layer and a second layer each of which have a top boundary and a bottom boundary. Further, assume that the first and second layers are substantially planar and that the bottom boundary of the second layer is coincident with the top boundary of the first layer (e.g., the second layer is on top of the first layer in a stacked relationship). The example first and second layers are each self-coplanar if and only if no material of the first layer extends above the bottom boundary of the second layer and no material of the second layer extends below the top boundary of the first layer. In other words, material of each of the first and second layers is strictly confined within the top and bottom boundaries of its respective layer. In contrast, when an example first layer is patterned and then an example second layer is deposited over the patterned first layer, some of the material of the second layer ends up in the openings in the patterned first layer (e.g., below the top boundary of the first layer). As such, the example first and second layers are not self-coplanar by definition herein.

Further, as used herein, the article 'a' is intended to have its ordinary meaning in the patent arts, namely 'one or more'. For example, 'a layer' means one or more layers and as such, 'the layer' means 'the layer(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Moreover, examples herein are intended to be illustrative only and are presented for discussion purposes and not by way of limitation.

FIG. 1 illustrates flow chart of a method 100 of combinatorial masking, according to an example consistent with the principles described herein. In some examples, the method 100 of combinatorial masking may be used to produce a multilayer circuit such as, but not limited to, an active matrix backplane. The active matrix backplane may be used in conjunction with a liquid crystal display (LCD), for example. In another example, the multilayer circuit may comprise a metal-insulator-metal structure such as a memristor array or another multilayer circuit comprising a combination of metal layers and semiconductor layers, for example.

As illustrated in FIG. 1, the method 100 of combinatorial masking comprises patterning 110 a first layer of a stack of material layers. According to various examples, the first layer may be at a top of or the surface layer of the stack of material layers. Further, the first layer has or exhibits mutually exclusive etch resistance with respect to a second layer of the stack that is located below the first layer in the stack, according various examples. For example, the second layer may be a bottom layer of the stack while the first layer is a top layer of the stack. In particular, the stack of material layers may be provided on a substrate (e.g., by vacuum deposition) prior to patterning 110. The second layer may be adjacent to the substrate at a bottom of the stack of material layers.

In some examples, the first layer comprises a first conductor material and the second layer comprises a second conductor material. In some examples, the first conductor material comprises a metal. For example, the first conductor material may comprise a metal such as, but not limited to copper (Cu), chromium (Cr), titanium (Ti), tungsten (W), nickel (Ni), aluminum (Al) and gold (Au). In some examples, the first conductor material may comprise combinations metals including metal alloys and metal combinations arranged in layers. For example, the first conductor material may be a layer of Au or may comprise one or more of a combination of chromium and molybdenum (e.g., a CrMo alloy), a combination of titanium and tungsten (e.g., TiW), and a layer of copper on top of a layer comprising Mo, Ti or an MoTi alloy.

In some examples, the second conductor material comprises a metal including, but not limited to, any of the metals and metal combinations listed above for the first conductor material. However, the first and second conductor materials are, by definition, different from one another in any particular realization of the stack of materials to provide the mutually exclusive etch resistance between the first layer and the second layer. For example, when the first conductor material comprises a metal selected from copper, chromium, titanium, tungsten, nickel and gold, the second layer may comprise aluminum. A selection of other example combinations of conductor materials is provided in Table 1 below.

According to various examples, patterning 110 the first layer may comprise applying a photoresist to a surface of the first layer. Patterning 110 may further comprise exposing the photoresist using a mask followed by developing the photoresist. Patterning 110 the first layer may further comprise etching the first layer using the developed photoresist as an etch mask. In some examples, the etch mask may be provided by imprinting a mask material with a pattern using imprint lithography, for example. Etching the first layer may comprise using one or more of a dry etch and a wet etch to pattern 110 the first layer according to the etch mask.

For example, when the first layer comprises molybdenum, a dry etch comprising exposure of the etch mask covered first layer to a fluorocarbon (C—F) plasma may be employed in patterning 110. In another example, when the first layer comprises chromium, a wet etch comprising Cyantek Cr-7 or a similar chromium-targeted etchant may be used to wet etch the first layer during patterning 110. Cyantek Cr-7 is a chromium-targeted wet etching product of Cyantek Corporation of Fremont, Calif. In yet another example, such as when the first layer comprises a combination of a layer of copper overlying a layer of titanium (e.g., Cu/Ti) or a copper layer overlying a molybdenum layer (e.g., Cu/Mo), patterning 110 the first layer may comprise etching the copper layer using a wet etchant such as Transene Copper Etch APS-100. Etching of the copper layer may then be followed by exposure of the mask-covered first layer to a C—F plasma to etch the underlying Ti or Mo layer of the first layer. Transene Copper Etch APS-100 is a copper-targeted wet etching product of Transene Corporation of Danvers, Mass. In a further example, when the first layer comprises silicon (e.g., doped polysilicon) as a conductor material, a wet etch comprising a potassium hydroxide (KOH) solution or an aqueous solution of nitric acid/ammonium fluoride ($HNO_3/NH_4F:H_2O$) may be used. For a dry etch of the polysilicon, a fluorine-based plasma etch may be used, for example.

In general, patterning 110 the first layer depends on the material used in the first layer as well as the materials of other layers in the stack (e.g., to insure mutually exclusive etch resistance with the second layer). However, in some examples, patterning 110 the first layer may be accomplished without regard for the mutually exclusive etch resistance of the second layer. For example, the second layer may be protected from etching associated with patterning 110 the first layer by an intervening material layer of the stack that has a requisite mutually exclusive etch resistance with respect to the first layer. A further discussion of etchants applicable to patterning 110 the first layer is provided in Table 1 and related discussion below.

Figure 2A:
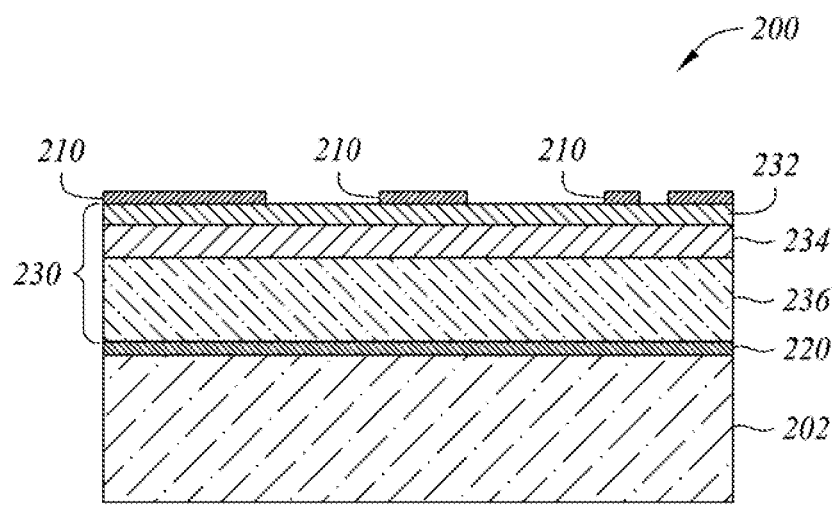
FIG. 2A illustrates a cross sectional view of a stack of material layers, according to an example consistent with the principles described herein.
Figure 2B:
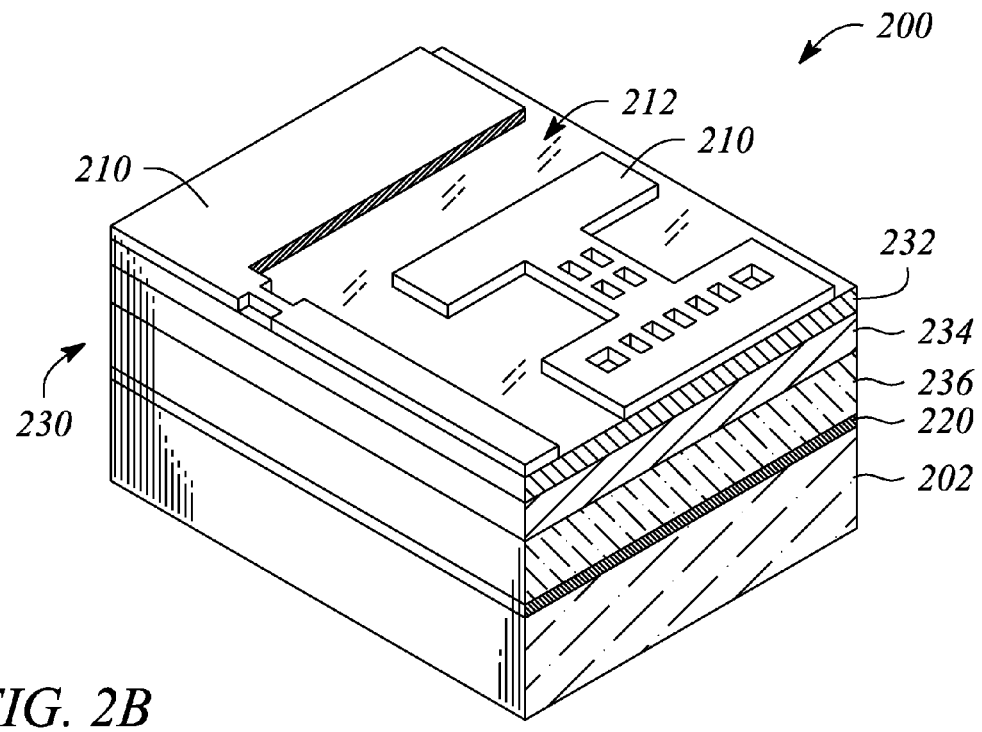
FIG. 2B illustrates a perspective view of the material layer stack illustrated in FIG. 2A, according to an example consistent with the principles described herein.

FIG. 2A illustrates a cross sectional view of a stack 200 of material layers, according to an example consistent with the principles described herein. FIG. 2B illustrates a perspective view of the material layer stack 200 illustrated in FIG. 2A, according to an example consistent with the principles described herein. In particular, FIGS. 2A and 2B illustrate the material layer stack 200 on a substrate 202 after patterning 110 a first layer 210 of the stack. The second layer 220 is illustrated as a bottom layer of the stack 200 (e.g., adjacent to the substrate 202), in FIGS. 2A and 2B. Further, a portion of an underlying intervening material layer 230 (e.g., a semiconductor layer 232) is visible through gaps or holes 212 in the patterned first layer 210. As illustrated, a pattern has been imparted to the first layer 210 by patterning 110 according to the method 100, while other layers are substantially continuous (i.e., unpatterned). In some examples, the intervening material layer 230 may comprise a plurality of material layers 232, 234, 236, as illustrated.

Referring again to FIG. 1, the method 100 of combinatorial masking further comprises providing 120 a secondary mask. In particular, the secondary mask is provided 120 on top of the patterned first layer. When provided 120, the secondary mask covers some areas or portions of a surface of the stack while simultaneously exposing other areas or portions according to a pattern of the secondary mask. In particular, the secondary mask may cover some portions of the first layer 210 while exposing other portions thereof.

For example, the secondary mask may comprise a photoresist that is applied to the first layer, exposed using a mask and then developed to produce the secondary mask. In another example, the secondary mask may be provided 120 using imprint lithography (e.g., nanoimprint lithography) to form a mask material into the secondary mask. The mask material formed by imprint lithography may be a mask material such as, but not limited to, polymethylmethacrylate (PMMA) into which a pattern of the secondary mask is imprinted. In yet another example, the secondary mask may be provided 120 by applying a patterned material to the patterned first layer. For example, the patterned material may be a mask that is produced prior to providing 120 and then glued or otherwise affixed to the patterned first layer.

Figure 2C:
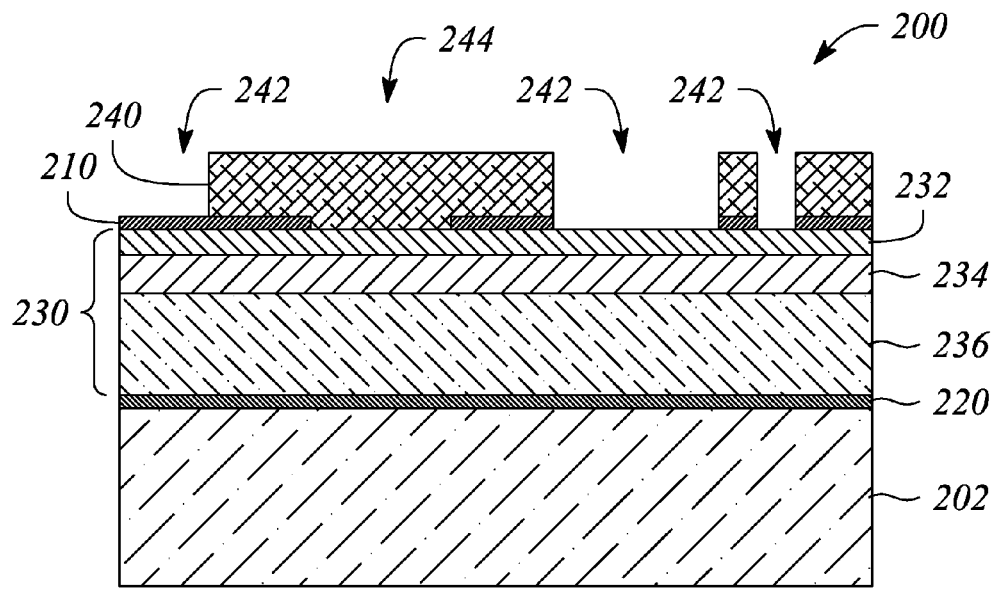
FIG. 2C illustrates a cross sectional view of the material layer stack of FIG. 2A after providing a secondary mask, according to an example of the principles described herein.

FIG. 2C illustrates a cross sectional view of the material layer stack 200 of FIG. 2A after providing 120 a secondary mask, according to an example of the principles described herein. In particular, the secondary mask 240 is illustrated on top of the patterned first layer 210. Openings 242 in the secondary mask 240 may expose both portions of the patterned first layer 210 and portions of the underlying intervening material layer 230, according to various examples. Moreover, the secondary mask 240 may cover other portions 244 of the underlying intervening material layer 230 that were previously exposed when the first layer 210 was patterned 110.

Referring again to FIG. 1, the method 100 of combinatorial masking further comprises etching 130 other material layers of the stack. Etching 130 the other material layers employs a combination of the patterned first layer and the secondary mask as a combinatorial etch mask, according to various examples. In particular, etching 130 other material layers explicitly includes etching the second layer of the stack to the exclusion of the first layer.

In some examples, etching 130 other material layers of the stack comprises etching an intervening material layer between the first layer and the second layer followed by etching the second layer. For example, a material layer between the first and second layers may be etched using an isotropic dry etch such as, but not limited to, reactive ion etching (RIE). Etching the second layer may then employ a wet etch to etch the second layer. In another example, etching an intervening material layer may employ an isotropic wet etchant that is tailored or selective for the material layer between the first and second layers (e.g., KOH wet etch for a silicon material layer) followed by a wet etchant that etches the second layer. In some examples, both the intervening layers and the second layer are isotropically etched together, followed by an additional wet etch of the second layer, as further described below.

Figure 2D:
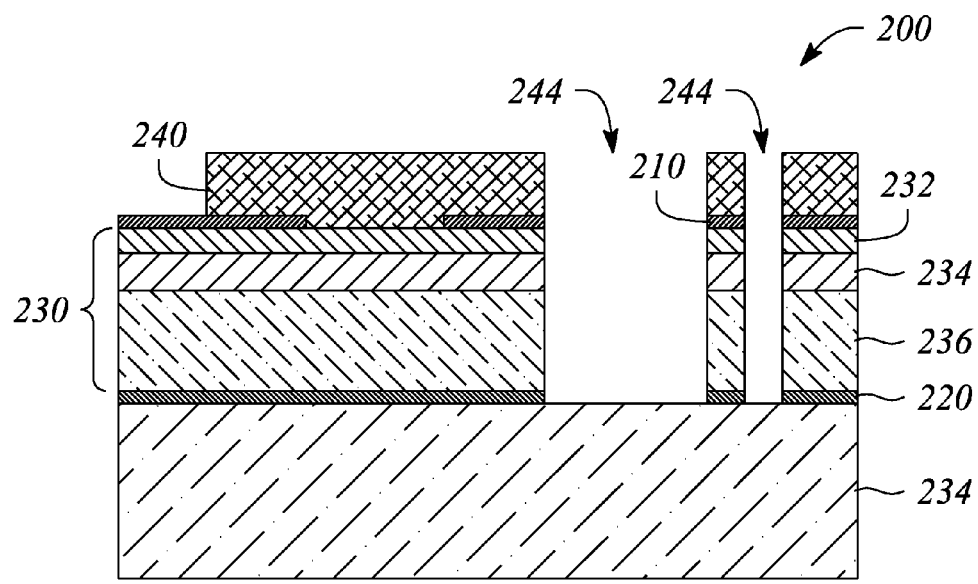
FIG. 2D illustrates a cross sectional view of the material layer stack of FIG. 2C after etching other material layers of the stack, according to an example of the principles described herein.

FIG. 2D illustrates a cross sectional view of the material layer stack 200 of FIG. 2C after etching 130 other material layers of the stack, according to an example of the principles described herein. In particular, as illustrated in FIG. 2D, material from each of the material layers of the underlying intervening material layer 230 below the combinatorial mask (i.e., the patterned first layer 210 plus the secondary mask 240) has been removed during etching 130. Further, portions of the second layer 220 corresponding to the pattern openings 244 in the combinatorial etch mask have been removed. In contrast, exposed portions of the first layer 210 through the secondary mask 240 have not been removed during etching 130.

In some examples, during etching 130, the second layer is etched comprising selectively over-etching the second layer below selected portions of the patterned first layer to undercut the other material layers that overlie the second layer. For example, a wet etch may be used for etching the second layer. The second layer may be exposed to the wet etch for a predetermined period of time that is long enough to not only remove portions of the second layer exposed by the combinatorial mask but also long enough to allow removal by the wet etch of portions of the second layer that extend under overlying material layers and to the exclusion of the other material layers. The removal of the second layer portions underlying another layer without removal of the other layer is defined herein as 'undercutting.' In some examples, a dry etch may be used remove the selected portions of the second layer to undercut an overlying material layer. For example, a dry etch that provides at least some anisotropic material removal of portions of the second layer may be employed to undercut the overlying material layer.

In some examples, the undercutting produces a gap in the second layer below the selected portions of the patterned first layer. In particular, if a width of the selected portions of the patterned first layer is less than an amount of undercutting provided by etching the second layer, a gap will be produced by etching the second layer below the selected portions of the patterned first layer. The gap may break a conduction path in the second layer when the second layer comprises a conductor, for example. The break may serve to isolate a portion of the second layer (e.g., electrically isolate), in some examples. In some examples, the gap may define a crossover in an electrical circuit constructed from the stack of material layers using the method 100 of combinatorial masking, for example.

Figure 3A:
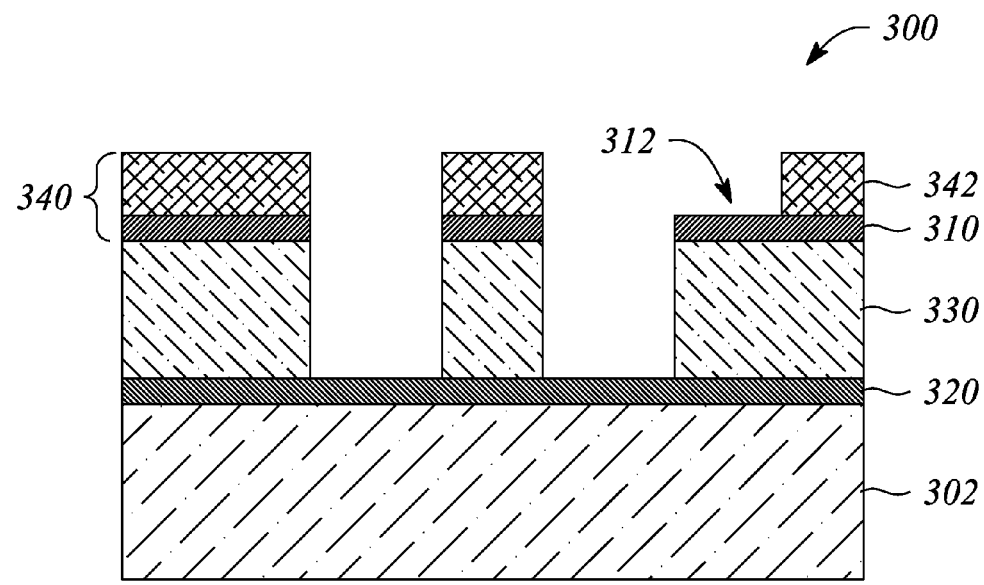
FIG. 3A illustrates a cross sectional view of a material layer stack before etching a second layer of the material layer stack, according to an example of the principles described herein.
Figure 3B:
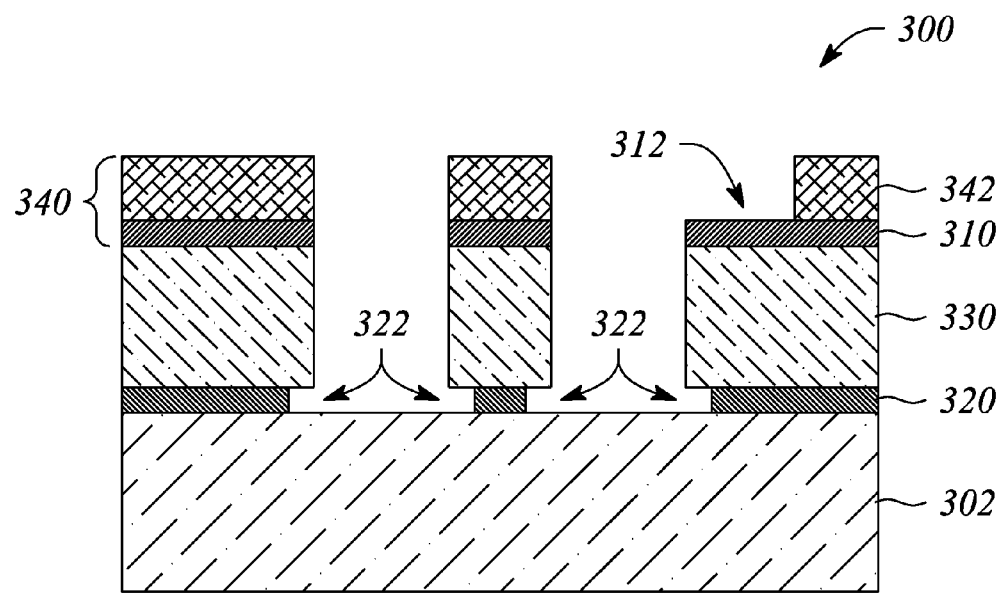
FIG. 3B illustrates a cross sectional view of the material layer stack of FIG. 3A after etching the second layer to undercut an overlying material layer, according to an example of the principles describe herein.
Figure 3C:
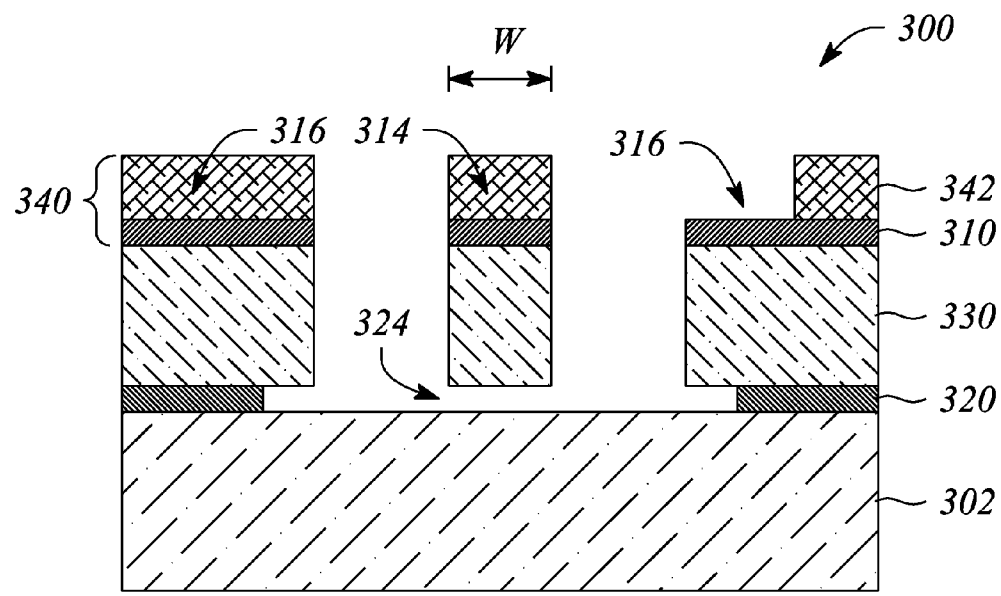
FIG. 3C illustrates a cross sectional view of the material layer stack of FIG. 3B after etching the second layer to produce a gap by undercutting, according to an example of the principles describe herein.

FIG. 3A illustrate a cross sectional view of a material layer stack 300 before etching a second layer of the material layer stack 300, according to an example of the principles described herein. FIG. 3B illustrates a cross sectional view of the material layer stack 300 of FIG. 3A after etching the second layer to undercut an overlying material layer, according to an example of the principles describe herein. FIG. 3C illustrates a cross sectional view of the material layer stack 300 of FIG. 3B after etching the second layer to produce a gap by undercutting, according to an example of the principles describe herein. FIGS. 3A-3C illustrate the material layer stack 300 on a substrate 302.

In particular, as illustrated in FIG. 3A, the material layer stack 300 comprises a first layer 310, a second layer 320 and a third layer 330 sandwiched between the first and second layers 310, 320. A combinatorial etch mask 340 is also illustrated that comprises a combination of a secondary mask 342 and the first layer 310 including portions 312 of the first layer 310 not covered by the secondary mask 342. In FIG. 3A, the third layer 330 has been etched 130 through the combinatorial mask 340 and portions of the second layer 320 have been exposed by the removal of the third layer 330 (e.g., intervening material layer 230). The exposed portions of the second layer 320 may correspond to a pair of openings in a combinatorial etch mask 340, for example.

In FIG. 3B, the exposed portion of the second layer 320 has been removed by etching the second layer 320. Also, etching the second layer 320 has been performed for a period of time that is long enough to produce some undercutting. In particular, the third layer 330 has been undercut at a location 322 by the removal of second layer material, as illustrated.

FIG. 3C illustrates the material layer stack 300 after etching of the second layer 320 has been performed for a period of time that is long enough to form a gap 324 in the second layer 320 under a selected portion 314 of the first layer 310. The selected portion 314 of the first layer 310 may be a portion that has a width W less than a predetermined width $W_{limit}$, for example. The width W may be less than an amount of the undercutting to insure that the gap 324 is formed, for example. As illustrated in FIG. 3C, undercutting under other portions 316 (e.g., wider portions than the selected portion 314) of the first layer 310 has not resulted in gap formation during etching the second layer 320, for example.

Referring once again to FIG. 1, the method 100 of combinatorial masking further comprises etching 140 the first layer along with the other material layers of the stack excluding the second layer. Etching 140 the first layer along with the other material layers employs the secondary mask as an etch mask. In particular, etching 140 removes portions of the first layer exposed by openings in the secondary mask as well as removes material of the other material layers below these openings. However, etching 140 these material layers selectively excludes and thus does not etch portions of the second layer below the openings in the secondary mask.

Figure 2E:
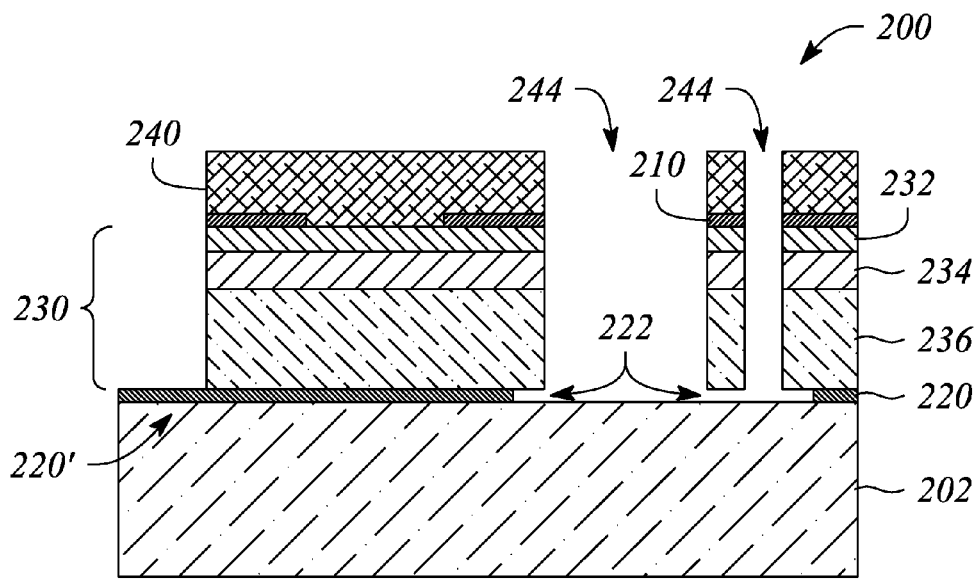
FIG. 2E illustrates a cross sectional view of the material layer stack of FIG. 2D after etching the first layer along with the other material layers excluding the second layer, according to an example of the principles described herein.

FIG. 2E illustrates a cross sectional view of the material layer stack 200 of FIG. 2D after etching 140 the first layer along with the other material layers excluding the second layer, according to an example of the principles described herein. In particular, FIG. 2E illustrates the removal by etching 140 of the portions of the first layer 210 along with portions of the other material layers (e.g., the intervening layer 230, including layers 232, 234, 236, as illustrated) underlying the portions of the first layer 210 that were exposed by openings 242 in the secondary mask 240. Further illustrated in FIG. 2E is a portion of the second layer 220' that remain after etching 140 these layers through the secondary mask 240. FIG. 2E also illustrates effects of undercutting 222, including the gap in the second layer 220, as a result of etching 130.

TABLE 1

Example first layer and second layer materials along with corresponding etchants to provide mutually exclusive etch resistance.

| First Layer | First Layer Etchant | Second Layer | Second Layer Etchant |
| --- | --- | --- | --- |
| Cr | Cyantek Cr—7S | Al | Cyantek AL12-S |
| Mo | Dry (fluorocarbon 'C—F' plasma) + Wet (Cyantek CR—7S) | Al | $H_3PO_4$ |
| Al | $H_3PO_4$ | Mo | Dry (C—F plasma) + Wet (Cyantek CR—7S) |
| Cu/Mo | Transene Cu APS-100 for Cu + C—F plasma for Mo | Al | $H_3PO_4$ |
| Cu/Ti | Transene Cu APS-100 for Cu + C—F plasma for Ti | Al | $H_3PO_4$ |
| Cu/MoTi Alloy | Transene Cu APS-100 for Cu + C—F plasma for MoTi Alloy | Al | $H_3PO_4$ |
| Ti | C—F plasma | Al | $H_3PO_4$ |
| Au | Transene Gold Etchant TFAC | Al | $H_3PO_4$ |
| Cu | Transene Cu APS-100 | Ni | Transene Nickel Etchant TFG |
| TiW | Transene TiW30 | Al | $H_3PO_4$ |

Table 1 provides a list of materials of the first and second layers along with example etchants that may be used to provide the mutually exclusive etch resistance between the first layer and the second layer when employing the listed materials. In particular, Table 1 includes a list of metals that may be used for the first and second layers, respectively. Further, Table 1 provides a list of example second layer etchants for use in etching 130 using the combinatorial mask along with a list of example first layer etchants for use in etching 140 using the secondary mask. The combinations of materials of the first and second layers along with the example first layer etchants and the second layer etchants provide mutually exclusive etch resistance materials between the first and second layers, for example. The list of examples in Table 1 is provided for discussion purposes only and is not intended to be either an exhaustive or a comprehensive list.

In some examples (not illustrated in FIG. 1), the method 100 of combinatorial masking further comprises removing the secondary mask and etching an exposed portion of one or more of the other material layers. In particular, etching the exposed portion may employ the patterned first layer as an etch mask. For example, etching the exposed portion may remove material of a material layer immediately below the first layer. In some examples, material of other layers below the material layer immediately below the first layer may be substantially unaffected by etching the exposed portion, or for example, may provide an etch stop. In other examples, material from more than one layer below the material layer immediately below the first layer may be etched using the patterned first layer as an etch mask.

Figure 2F:
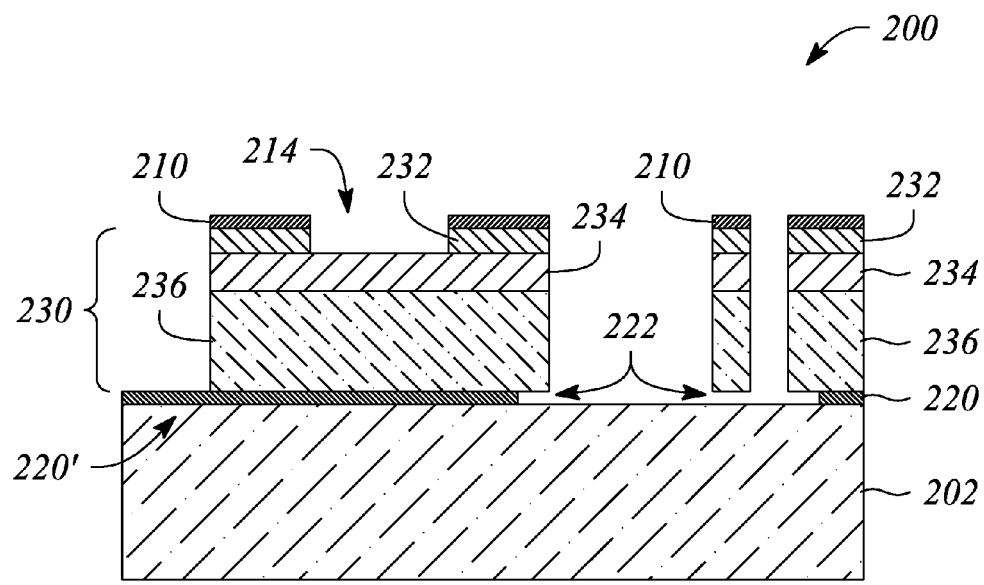
FIG. 2F illustrates a cross sectional view of the material layer stack of FIG. 2E after etching an exposed portion of a first intervening material layer, according to an example of the principles described herein.

FIG. 2F illustrates a cross sectional view of the material layer stack 200 of FIG. 2E after etching an exposed portion of a first intervening material layer 232, according to an example of the principles described herein. In particular, FIG. 2F illustrates the material layer stack 200 after removal of the secondary mask 240 (of FIG. 2E) and the patterned first layer 210 as an etch mask. As illustrated, a portion of the first intervening material layer 232 exposed by an opening 214 in the patterned first layer 210 has been removed. Further, other intervening material layers 234, 236 remain after etching in this example, as illustrated.

Figure 4:
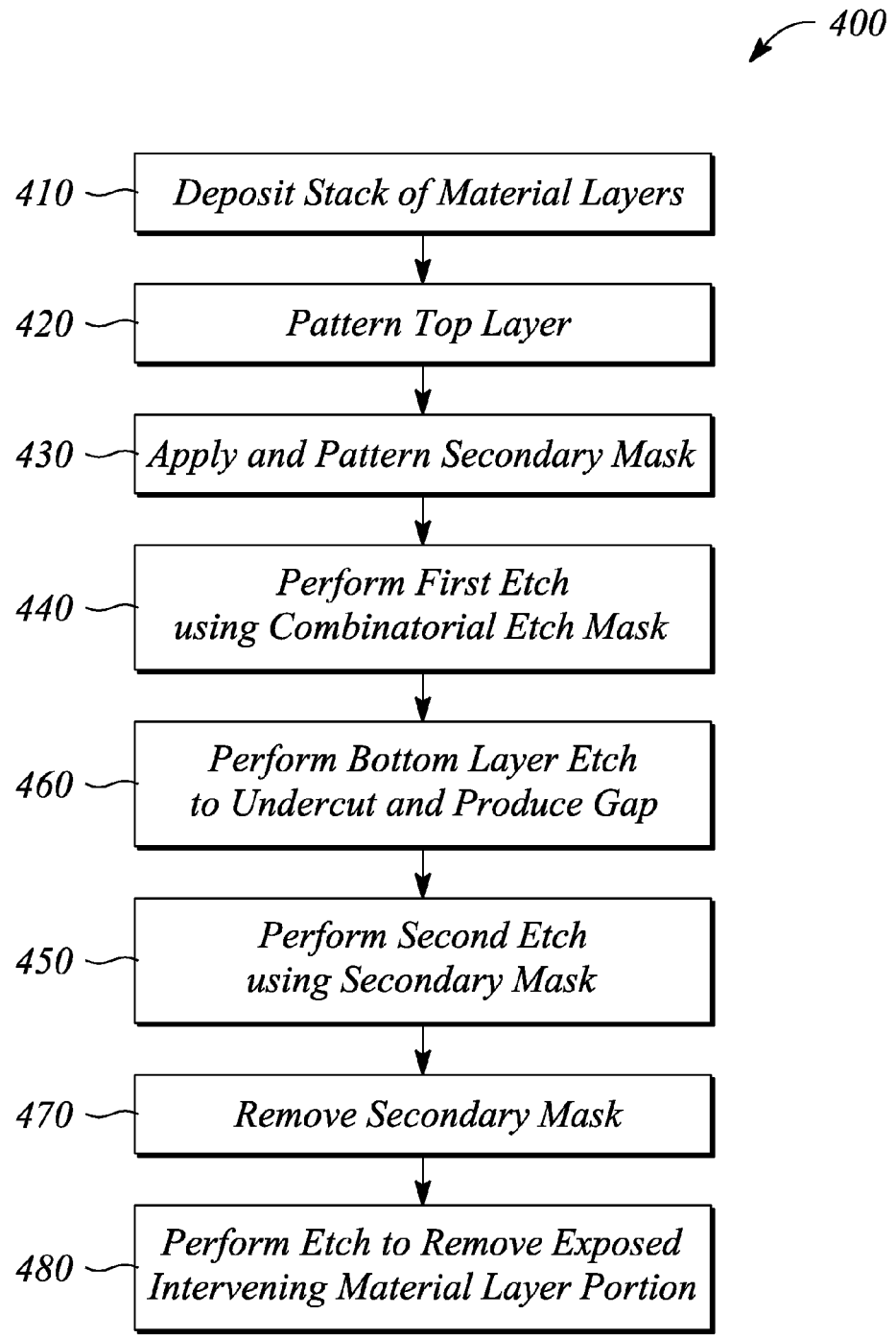
FIG. 4 illustrates a flow chart of a method of fabricating a multilayer active matrix backplane (AMB), according to an example consistent with the principles described herein.

FIG. 4 illustrates a flow chart of a method 400 of fabricating a multilayer active matrix backplane (AMB), according to an example consistent with the principles described herein. As illustrated, the method 400 of fabricating a multilayer AMB comprises depositing 410 a stack of substantially parallel material layers of the multilayer AMB. The stack of material layers of the multilayer AMB may be deposited 410 on a planar substrate, according to some examples. In some examples, the stack may be deposited 410 as substantially planar material layers. For example, a substrate may be introduced into a vacuum deposition chamber and the material layers may be deposited 410 using vacuum deposition such as, but not limited to, evaporative deposition, chemical vapor deposition (CVD), plasma enhanced chemical vapor deposition (PECVD), and sputter deposition. In other examples, substantially non-vacuum based deposition techniques may be employed in depositing 410 including, but not limited to, spin-casting, gravure coating and other solution-based film deposition processes (e.g., for organic semiconductors, etc.).

Depositing 410 the stack may comprise sequentially depositing the material layers of the multilayer AMB stack starting with a bottom layer and ending with a top layer. All of the material layers may be substantially planar, parallel, and continuous (i.e., unpatterned) layers after deposition, according to various examples. Moreover, depositing 410 the stack may be accomplished for all of the material layers of the multilayer AMB stack in a single operation in the vacuum deposition chamber. The multilayer AMB stack produced by depositing 410 according to the method 400 may be substantially similar to the stack of material layers discussed above with respect to the method 100 of combinatorial masking, according to some examples.

In some examples, the multilayer AMB stack produced on the substrate comprises a top layer that is a top conductor of the multilayer AMB and a bottom layer that is a bottom conductor of the multilayer AMB adjacent to the substrate, for example. In some examples, the multilayer AMB stack further comprises other intervening material layers located between the top layer and the bottom layer. For example, the other intervening material layers may comprise a first semiconductor layer below and directly adjacent to the top layer. The first semiconductor layer may be heavily doped to act as a contact layer of the multilayer AMB to contact the top conductor of the multilayer AMB, for example. In some examples, the first semiconductor layer may comprise an extrinsic semiconductor heavily doped with an n-type dopant to be an n+ doped semiconductor layer. For example, the first semiconductor layer may comprise a layer of silicon heavily doped with phosphorous. In other examples, the first semiconductor layer may comprise an extrinsic semiconductor heavily doped with a p-type dopant to be a p+ doped semiconductor layer (e.g., silicon heavily doped with boron).

In some examples, the other intervening material layers further comprise a second semiconductor layer below and directly adjacent to the first semiconductor layer, for example. The second semiconductor layer may be either undoped (i.e., intrinsic) or lightly doped to act as an active layer, for example in a thin film transistor that is subsequently patterned in the stack of the multilayer AMB, for example. For example, the active layer may be a channel or channel layer of the thin film transistor. In some examples, the second semiconductor layer may comprise amorphous silicon (e.g., a-Si).

In some examples, the other intervening material layers may further comprise a dielectric layer. The dielectric layer may be located between the second semiconductor layer and the bottom conductor layer of the multilayer AMB, for example. In some examples, the dielectric layer may be a dielectric, for example of a capacitor (e.g., a hold capacitor) that is subsequently patterned in the stack of the multilayer AMB. Examples of dielectric materials that may be used in the dielectric layer include, but are not limited to, silicon dioxide ($SiO_2$), hafnium oxide ($HfO_2$) and silicon nitride ($Si_3N_4$).

Referring again to FIG. 4, the method 400 of fabricating a multilayer AMB further comprises patterning 420 the top layer of the deposited stack. In some examples, patterning 420 the top layer may be substantially similar to patterning 110 a top layer described above with respect to the method 100 of combinatorial masking. In particular, patterning 420 the top layer may employ an etch mask and etching of the top layer to transfer an etch mask pattern to the top layer. When the top layer comprises a metal or a metal combination listed in Table 1, a corresponding first layer etchant from Table 1 may be used in patterning 420 the top layer, for example.

The method 400 of fabricating a multilayer AMB illustrated in FIG. 4 further comprises applying and patterning 430 a secondary mask on top of the patterned top layer. In some examples, applying and patterning 430 a secondary mask may be substantially similar to providing 120 a secondary mask described above with respect to the method 100 of combinatorial masking. In particular, applying and patterning 430 may employ photolithography or imprint lithography to produce the secondary mask from a layer of an etch resist. For example, the secondary mask may comprise a photoresist that is applied to a top layer, exposed using a photomask, and then developed to yield the secondary mask.

As illustrated in FIG. 4, the method 400 of fabricating a multilayer AMB further comprises performing 440 a first etch to remove portions of material layers in the deposited stack. According to various examples, performing 440 a first etch employs a combination of the patterned top layer and the patterned secondary mask as a combinatorial etch mask. The portions of material layers removed as a result of performing 440 a first etch are those portions that correspond to openings (i.e., are exposed by) the combinatorial etch mask, according to various examples. In some examples, performing 440 a first etch is substantially similar to etching 130 other material layers of the stack described above with respect to the method 100 of combinatorial masking. In particular, performing 440 a first etch removes portions of the bottom layer (i.e., bottom conductor) along with portion of the other intervening material layers between the top and bottom layers of the deposited stack, according to some examples. Further, in some examples, performing 440 a first etch may rely on a mutually exclusive etch resistance between the top layer and the bottom layer of the deposited stack.

The method 400, as illustrated in FIG. 4, further comprises performing 450 a second etch. The second etch is performed 450 to remove portions of the patterned top layer along with portions of the other intervening material layers of the deposited stack excluding the bottom layer adjacent to the substrate. According to various examples, performing 450 a second etch uses the patterned secondary mask as an etch mask. In some examples, performing 450 a second etch is substantially similar to etching 140 the first layer along with other material layers of the stack excluding the second layer of the method 100 of combinatorial masking, described above.

In some examples, the method 400 of fabricating a multilayer AMB further comprises performing 460 an etch of the bottom layer of the deposited stack. According to various examples, the bottom layer etch is performed 460 to produce an undercut region in the bottom layer (i.e., the bottom conductor of the multilayer AMB) at selected locations underlying the patterned top layer. According to some examples, the undercut region may produce a gap in the bottom layer at a selected location. The gap is substantially devoid of material of the deposited stack, according to some examples. In particular, the gap may be substantially devoid of material of a layer of the deposited stack that is immediately above or below the bottom layer. Further, the gap in the bottom layer may provide a break in a conduction path within the bottom conductor of the multilayer AMB, in some examples. The conduction path break either may be a part of a crossover of the multilayer AMB or may serve to electrically isolate a portion of the bottom conductor from other portions (e.g., traces) of the bottom conductor, for example. In some examples, the bottom layer etch is performed 460 before performing 450 a second etch (e.g., as illustrated). In some examples, the bottom layer etch is performed 460 following performing 440 a first etch. In particular, in some examples, performing 460 the bottom layer etch may be substantially similar to etching the second layer described above with respect to etching 130 of the method 100 of combinatorial masking.

In some examples (e.g., as illustrated in FIG. 4), the method 400 of fabricating a multilayer AMB further comprises removing 470 the secondary mask. For example, when the secondary mask comprises a photoresist, removing 470 may comprise washing with a solvent that dissolves the photoresist. In some examples (e.g., as illustrated in FIG. 4), the method 400 of fabricating a multilayer AMB further comprises performing 480 an etch to remove an exposed portion of an intervening material layer of the deposited stack using the top layer as an etch mask. The portion of the intervening material layer may be a material layer immediately below (i.e., directly adjacent to) the top layer of the deposited stack, for example. Performing 480 the etch selectively removes the exposed portion of the intervening material layer. In some examples, the exposed portion of the intervening material layer is selectively removed without substantially removing material of another intervening material layer of the deposited stack below the exposed portion. For example, the etch may be performed 480 to remove a portion of the contact layer bridging between a drain contact and a source contact of the thin film transistor of the multilayer AMB. The etch is performed to remove the contact layer without substantially removing the a-Si layer that forms the channel or channel layer of the thin film transistor below the contact layer in the multilayer AMB, for example.

Figure 5A:
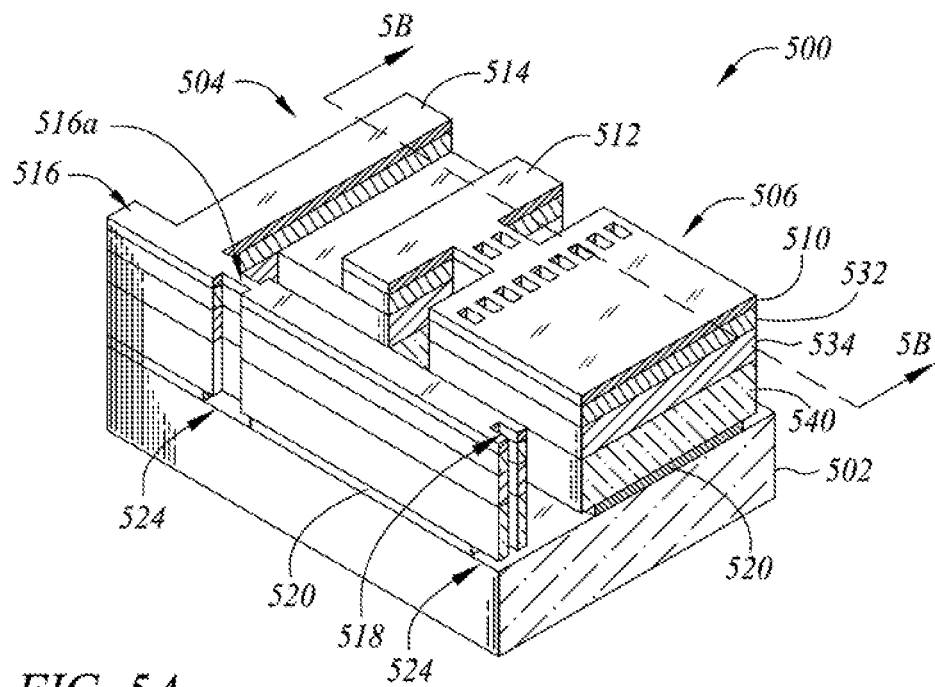
FIG. 5A illustrates a perspective view of a portion of a multilayer circuit assembly, according to an example consistent with the principles described herein.
Figure 5B:
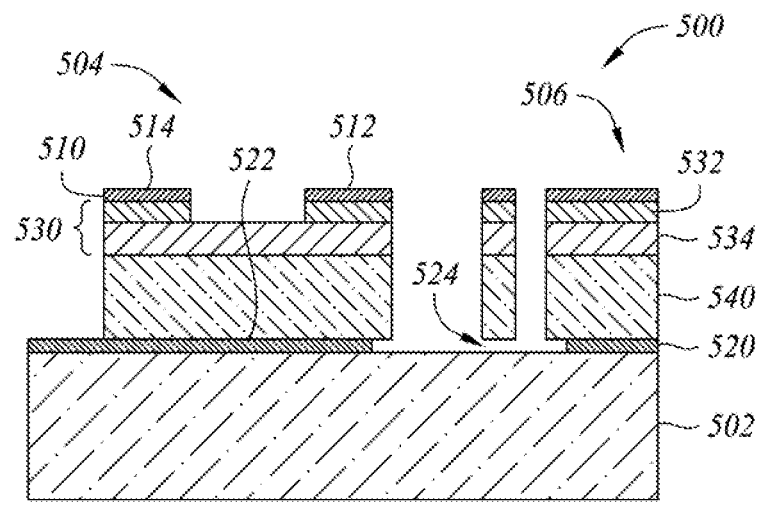
FIG. 5B illustrates a cross section through the multilayer circuit assembly illustrated in FIG. 5A, according to an example consistent with the principles described herein.

FIG. 5A illustrates a perspective view of a portion of a multilayer circuit assembly 500, according to an example consistent with the principles described herein. FIG. 5B illustrates a cross section through the multilayer circuit assembly 500 illustrated in FIG. 5A, according to an example consistent with the principles described herein. In some examples, the multilayer circuit assembly 500 may be a multilayer active matrix backplane (AMB) 500 (e.g., as described herein by way of example and not limitation). A complete multilayer AMB 500 may comprise a plurality (e.g., many thousands) of the portion illustrated in FIGS. 5A and 5B, for example. According to various examples, the multilayer AMB 500 may comprise circuitry including, but not limited to, a thin film transistor (TFT) 504, a capacitor 506 (e.g., a hold capacitor) and various traces that interconnect elements of the multilayer AMB. The circuitry of the multilayer AMB 500 may be supported by a substrate 502, in some examples. In other examples (not illustrated), the multilayer circuit assembly 500 may implement another circuit such as, but not limited to, a capacitive array and a memristor array.

As illustrated, the multilayer AMB 500 comprises a top conductor layer 510 that is patterned to define portions of various circuit elements and traces (e.g., data lines or traces) of the multilayer AMB 500. In particular, according to some examples, the top conductor layer 510 may be patterned to define a source contact 512 and a drain contact 514 of the TFT 504. The top conductor layer 510 may further be patterned to define a top trace 516 (e.g., a data line to access the TFT 504), in some examples.

According to some examples, the top trace 516 has a narrow portion with a trace width W that is less than a predetermined width $W_{limit}$ (i.e., $W<W_{limit}$). In some examples, the predetermined width $W_{limit}$ may be less than about 10 microns (µm). For example, the predetermined width $W_{limit}$ may be between about 2 µm and about 8 µm. In other examples, the predetermined width $W_{limit}$ may be less than about 5 µm. For example, the predetermined width $W_{limit}$ may be between about 4 µm and about 5 µm.

As illustrated in FIG. 5A, the trace width W in the narrow portion may be provided by a neck 516a in the top trace 516, for example. In another example, a hole 518 may be provided in the top trace 516 to introduce or create a narrow portion, also illustrated in FIG. 5A. When the hole 518 is provided, the trace width W of the narrow portion may be a sum of a width of the top trace 516 on either side of the hole 518, for example.

The multilayer AMB 500 further comprises a bottom conductor 520 that is located below the top conductor layer 510, as illustrated. The bottom conductor layer 520 is patterned to define additional portions of the various circuit elements and traces of the multilayer AMB 500, according to various examples. In particular, the bottom conductor layer 520 may be patterned to define a gate 522 (see FIG. 5B) of the TFT 504, according to some examples. In some examples, the bottom conductor layer 520 has at least one gap 524. As illustrated in FIG. 5A, the gap 524 is located directly below the narrow portion or neck 516a in the top trace 516 of the top conductor layer 510, according to various examples. The gap 524 may provide an electrical isolation between portions of the bottom conductor layer 520 on either side of the gap 524, for example. The electrical isolation may be used in forming a crossover in circuitry of the multilayer AMB 500 as well as serve to electrically isolate a component or portion thereof (e.g., a plate of a capacitor) of the multilayer AMB 500.

In some examples, the trace width W in the narrow portion of the top trace 516 above the gap 524 in the bottom conductor layer 520 has a predetermined width $W_{limit}$ that is less than an amount or width of undercutting $W_{undercut}$ (e.g., $W_{limit} < W_{undercut}$) employed in fabricating the multilayer AMB. In particular, the predetermined width $W_{limit}$ may be a width determined by an amount or distance of undercutting used during etching of the bottom layer 520 (e.g., see methods 100, 400 for etching of a second or bottom layer). In some examples, if the predetermined width $W_{limit}$ and thus the trace width W in the narrow portion is less than the undercutting distance, undercutting may produce or form the gap 524, as described hereinabove with respect to the method 100 of combinatorial masking Hence, the gap 524 is formed directly under the narrow portion of the top trace 516 during fabrication.

As illustrated in FIG. 5B, the multilayer AMB 500 further comprises a semiconductor layer 530 sandwiched between the top conductor layer 510 and the bottom conductor layer 520. The semiconductor layer 530 may be a portion of an inter-conductor layer of the multilayer circuit assembly 500, for example. In some examples, the semiconductor layer 530 may be substantially similar to the semiconductor layer(s) described above with respect to the method 400 of fabricating a multilayer AMB. In particular, the semiconductor layer 530 may comprise a first semiconductor layer portion 532 (e.g., n+Si) that is heavily doped and in contact with the top conductor layer 510. The first semiconductor layer 532 may serve as a contact layer at the source contact 512 and the drain contact 514 of the TFT 504, for example. The semiconductor layer 530 may further comprise a second semiconductor layer portion 534 (e.g., a-Si). The second semiconductor layer portion 534 may be substantially undoped or lightly doped and may serve as a channel of the TFT 504, for example. The semiconductor layers 532, 534 are also illustrated in perspective view in FIG. 5A, for example.

In some examples (e.g., illustrated in FIGS. 5A-5B), the multilayer AMB further comprises a dielectric layer 540 between the bottom conductor layer 520 and the semiconductor layer 530. The dielectric layer 540 may be another portion of the inter-conductor layer of the multilayer circuit assembly 500 (e.g., the inter-conductor layer may comprise layers 530 and 540), for example. In some examples, the capacitor 506 of the multilayer AMB 500 may comprise a portion of the dielectric layer 540 between a top plate of the capacitor provided by the top conductor layer 510 and a bottom plate of the capacitor 506 provided by the bottom conductor layer 520. In some examples, portions of the semiconductor layer 530 may also be located between the top and bottom plates of the capacitor 506, as illustrated. The dielectric layer 540 may be substantially similar to the dielectric layer described above with respect to the method 100 of combinatorial masking. In particular, examples of dielectric materials that may be used in the dielectric layer 540 include, but are not limited to, silicon dioxide ($SiO_2$), hafnium oxide ($HfO_2$) and silicon nitride ($Si_3N_4$).

In various examples, the inter-conductor layer (e.g., 530, 540) of the multilayer circuit assembly 500 generally separates the top conductor layer 510 and the bottom conductor layer 520. In some examples (not illustrated), such as circuit assemblies other than the illustrated multilayer AMB 500, the inter-conductor layer may comprise other materials or other material layers besides or in addition to the semiconductor layer 530 and the dielectric layer 540. The other material layers may include, but are not limited to, a transition metal oxide layer. For example, a transition metal oxide layer may be used between the top conductor layer 510 and the bottom conductor layer 520 to implement a memristor array. In another example, the inter-conductor layer may comprise only the dielectric layer 540 such as when the multilayer circuit assembly implements a capacitive array.

According to various examples, the top conductor layer 510, the bottom conductor layer 520, and the inter-conductor layer (e.g., the semiconductor layer 530, the dielectric layer 540, etc., as described above) are self-coplanar layers. In particular, material in each of these layers is substantially confined between planes that define upper and lower boundaries of the layers. As such, material from a first layer is not found within the planar region of another, directly adjacent layer, according various examples. In some examples, the gap 524 in the bottom conductor layer 520 is substantially devoid of material from an overlying layer adjacent to the bottom conductor layer above the gap 524. For example, material from an overlying layer such as the semiconductor layer 530 or the dielectric layer 540 that is in contact with the bottom conductor layer 520 is not substantially present in the gap 524. The gap 524 being devoid of material from an overlying layer is also consistent with the self-coplanar nature of the layers 510, 520, 530 and 540, of the multilayer AMB 500, for example.

According to some examples, metals and other materials used in the top conductor layer 510 and the bottom conductor layer 520 of the multilayer AMB may exhibit mutually exclusive selective etch resistance. In particular, the top conductor layer 510 and the bottom conductor layer 520 may comprise different metals that have mutually exclusive selective etch resistance, according to some examples. The mutually exclusive etch resistance may facilitate manufacture of the multilayer AMB 500, for example (e.g., using the method 400 of fabricating, above).

Thus, there have been described examples of a method of combinatorial masking, a multilayer circuit assembly and a method of fabricating a multilayer AMB that each employs multiple layers having mutually exclusive selective etch resistance. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A method of combinatorial masking, the method comprising:
  patterning a first layer of a stack of material layers to form a patterned first layer, the patterned first layer being at a top of the stack and having a mutually exclusive selective etch resistance with respect to a second layer of the stack located below the patterned first layer;
  providing a secondary mask on top of the patterned first layer;
  etching other material layers of the stack including the second layer employing a combination of the patterned first layer and the secondary mask as a combinatorial etch mask; and etching the patterned first layer along with the other material layers of the stack excluding the second layer using the secondary mask as an etch mask.

2. The method of combinatorial masking of claim 1, further comprising providing the stack of material layers on a substrate with the second layer adjacent to the substrate at a bottom of the stack, the stack of material layers being deposited before patterning the first layer.

3. The method of combinatorial masking of claim 1, wherein the first layer comprises a first conductor material and the second layer comprises a second conductor material, the second layer being at a bottom of the stack adjacent to a substrate.

4. The method of combinatorial masking of claim 3, wherein the first conductor material comprises a metal selected from copper, chromium, titanium, tungsten, nickel and gold, and wherein the second conductor material comprises aluminum.

5. The method of combinatorial masking of claim 3, wherein the stack comprises material layers of an active matrix backplane comprising a thin film transistor and a capacitor, the method of combinatorial masking forming a source and a drain of the thin film transistor and a top conductor of the capacitor with the first layer, and the method of combinatorial masking forming both a gate of the thin film transistor and a bottom conductor of the capacitor with the second layer.

6. The method of combinatorial masking of claim 1, wherein providing a secondary mask comprises:
applying a photoresist to the surface of the patterned first layer; and
patterning the photoresist to form the secondary mask.

7. The method of combinatorial masking of claim 1, wherein etching other material layers comprises etching the other material layers through the combinatorial etch mask and selectively over-etching the second layer below selected portions of the patterned first layer to undercut the other material layers that overlie the second layer, the undercutting producing a gap in the second layer below the selected portions of the patterned first layer.

8. The method of combinatorial masking of claim 1, further comprising:
removing the secondary mask; and
etching an exposed portion of one or more of the other material layers using the patterned first layer as an etch mask.

9. A method of fabricating a multilayer active matrix backplane (AMB) using combinatorial masking, the method comprising:
depositing a stack of substantially planar material layers of the multilayer AMB on a substrate;
patterning a top layer of the deposited stack to form a patterned top layer, the patterned top layer being a top conductor of the multilayer AMB;
applying and patterning a secondary mask on top of the patterned top layer;
performing a first etch to remove portions of underlying material layers in the deposited stack employing a combination of the patterned top layer and the patterned secondary mask as a combinatorial etch mask; and
performing a second etch to remove portions of the patterned top layer along with portions of the underlying material layers of the deposited stack excluding a bottom layer of the deposited stack that is adjacent to the substrate using the patterned secondary mask as an etch mask, wherein the bottom layer is a bottom conductor of the multilayer AMB.

10. The method of fabricating a multilayer AMB of claim 9, further comprising etching the bottom layer before performing the second etch to produce an undercut region in the bottom layer at selected locations underlying the patterned top layer, the undercut region producing a gap in the bottom layer at the selected locations, the gap being substantially devoid of material of the deposited stack, wherein the bottom layer etch is performed before performing the second etch.

11. The method of fabricating a multilayer AMB of claim 10, wherein the top layer comprises a first metal and the bottom layer comprises a second metal, the first and second metals having mutually exclusive selective etch resistance, the produced gap created to interrupt a conductive path in the second metal of the bottom layer at the selected locations to one or both of form crossovers and isolate conductor regions in the bottom layer.

12. The method of fabricating a multilayer AMB of claim 9, further comprising:
removing the secondary mask; and
performing an etch to remove an exposed portion of an intervening material layer of the deposited stack between the patterned top layer and the bottom layer using the patterned top layer as an etch mask, wherein performing the etch selectively removes the exposed portion of the intervening material layer without substantially removing material of another intervening material layer of the deposited stack below the exposed portion.

13. The method of fabricating a multilayer AMB of claim 9, wherein the material layers in the deposited stack intervening between the top layer and the bottom layer comprise:
a first semiconductor layer below the top layer, the first semiconductor layer being heavily doped to act as a contact layer to contact the top conductor of the multilayer AMB;
a second semiconductor layer below the first semiconductor layer, the second semiconductor layer being either undoped or lightly doped to act as an active layer in a thin film transistor of the multilayer AMB; and
a dielectric layer between the second semiconductor layer and the bottom conductor of the multilayer AMB.

14. A multilayer circuit assembly comprising:
a top conductor layer having patterns to define a top trace, the top trace having a narrow portion with a trace width that is less than a predetermined width;
a bottom conductor layer having patterns to define at least one gap, the bottom conductor layer being located below the top conductor layer, the gap being aligned below the narrow portion; and
a sandwiched layer sandwiched between the top conductor layer and the bottom conductor layer and comprising at least one of a semiconductor layer and a dielectric layer, wherein the top conductor layer, the sandwiched layer and the bottom conductor layer are each self-coplanar layers, the top conductor layer and the bottom conductor layer comprising materials having mutually exclusive etch resistances, and the gap being substantially devoid of a material from a layer adjacent to and overlying the gap.

15. A multilayer circuit assembly, comprising:
a top conductor layer patterned to define a top trace, the top trace having a narrow portion with a trace width that is less than a predetermined width;

a bottom conductor layer patterned to define at least one gap, the bottom conductor layer being located below the top conductor layer, the gap being aligned below the narrow portion; and a sandwiched layer comprising one or both of a semiconductor layer and a dielectric layer, wherein the sandwiched layer is sandwiched between the top conductor layer and the bottom conductor layer, wherein the top conductor layer, the sandwiched layer and the bottom conductor layer are each self-coplanar layers, the top conductor layer comprising a different material from that of the bottom conductor layer, the gap being substantially devoid of a material from a layer adjacent to and overlying the gap, wherein the multilayer circuit assembly is a multilayer active backplane, the top conductor layer being further patterned to define a source contact and a drain contact of a thin film transistor (TFT), and the bottom conductor layer being patterned to define a gate of the TFT.

* * * * *